United States Patent
Gadkaree et al.

(10) Patent No.: US 6,803,028 B2
(45) Date of Patent: Oct. 12, 2004

(54) METHOD OF MAKING STOICHIOMETRIC LITHIUM NIOBATE

(75) Inventors: Kishor P. Gadkaree, Big Flats, NY (US); Kamal K. Soni, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 303 days.

(21) Appl. No.: 10/118,983

(22) Filed: Apr. 8, 2002

(65) Prior Publication Data

US 2003/0190132 A1 Oct. 9, 2003

(51) Int. Cl.[7] .......................... G01G 33/00; C01D 1/00
(52) U.S. Cl. ............................ 423/594.8; 423/594.17; 423/641
(58) Field of Search .............................. 428/689, 697, 428/701, 702, 336; 423/594.2, 594.3, 594.8, 641, 594.17, 594.47

(56) References Cited

U.S. PATENT DOCUMENTS

| | | | |
|---|---|---|---|
| 4,071,323 A | 1/1978 | Holman | 23/273 |
| 4,071,396 A | 1/1978 | Holman | 156/612 |
| 4,196,963 A | 4/1980 | Chen et al. | 350/96.12 |
| 4,725,330 A | 2/1988 | Holmes et al. | 156/610 |
| 4,781,743 A * | 11/1988 | Holmes et al. | 65/30.13 |
| 5,209,917 A * | 5/1993 | Ohno et al. | 423/594.8 |
| 5,315,432 A * | 5/1994 | Ohno | 359/326 |
| 5,442,719 A | 8/1995 | Chang et al. | 385/3 |
| 5,985,022 A * | 11/1999 | Fukuda et al. | 117/11 |

FOREIGN PATENT DOCUMENTS

| | | |
|---|---|---|
| EP | 0 635 735 | 1/1995 |
| WO | WO 01/29593 | 4/2001 |
| WO | WO 01/29594 | 4/2001 |

* cited by examiner

Primary Examiner—Stephen Stein
(74) Attorney, Agent, or Firm—Timothy M. Schaeberle; James V. Suggs

(57) ABSTRACT

Methods of manufacturing stoichiometric lithium niobate elements are provided. The method involves heating lithium niobate substrates in the presence of a monolithic sintered source of lithium and/or niobium. The method is useful for producing lithium niobate optical elements such as waveguides, switches and modulators.

18 Claims, 4 Drawing Sheets

US 6,803,028 B2

METHOD OF MAKING STOICHIOMETRIC LITHIUM NIOBATE

FIELD OF THE INVENTION

This invention relates to lithium niobate elements. More particularly, the invention relates to stoichiometric lithium niobate devices such as waveguides and modulators and methods for their manufacture.

BACKGROUND OF THE INVENTION

Electro-optic modulators have become one of the key components for high speed optical transmission systems. Lithium niobate single crystal materials are used in these applications because of the high electrooptic coefficient of lithium niobate materials. Single crystal lithium niobate wafers having a thickness of about 1–2 mm are generally used as substrate materials for these applications. Waveguide are written into these substrates via a variety of techniques, including but not limited to Ti thermal diffusion, Ti ion implantation, and proton exchange. Thermal diffusion of Ti ions is the most efficient and generally accepted practice. The waveguide is written to a depth of about 10 microns. The in-diffusion of Ti is performed at temperatures near 1000° C.

The properties of the lithium niobate crystals depend on the composition of the crystals. The most widely industrially produced crystals have a composition that is referred to as the congruent composition. This congruent composition has a lithium to niobium ratio of about 48 to 52 or 0.94. The congruent composition crystals are produced by Czochralski method from lithium niobate melts at a very high crystal growth rate, typically around 8 to 10 mm/hr.

Conversely, the lithium niobate crystals of stoichiometric composition, that is, having a lithium to niobium ratio of 50 to 50 or about 1, are reported to have significantly higher electrooptic coefficients. In addition, the crystals of stoichiometric composition have higher non-linear characteristics, wider transparency range and higher resistance to optical damage. These stoichiometric crystals have to be fabricated via flux growth process, where the Li and Niobium oxides are dissolved in high temperature solvents such as $K_2O$ or other solvents, and then crystals are grown from the solution. Typically, these stoichiometric crystals can be grown at slightly lower temperatures, but the crystal growth rate drops by an order of magnitude. Due to the low growth rate and the low crystal yield obtained from the process, these crystals are prohibitively expensive. Thus, even though the stoichiometric crystals have numerous desirable properties, the high production costs prevent their use in most applications.

U.S. Pat. No. 4,725,330 (the '330 patent) discloses a process for equilibrating lithium niobate substrates that involves heat treating the substrate in close proximity to a powder bed containing a source of lithium in a closed container. The '330 patent suggests placing the powders to at least within 2 cm to the substrate, and in some instances burying the substrate in the powder bed. The '330 patent further teaches that the chemical composition of the powdered bed should be the same as the desired chemical composition in the crystal, which is a Li/Nb ratio of 50/50 or 1. The small difference in crystal composition between the powder bed and the crystal composition leads to very large equilibration times of about 500 hours. One disadvantage of this process is that processing in close proximity to a powder bed will require further processing steps such as polishing and clean to remove any adhered powder to the substrate surface. In addition, the processing times of 500 hours are time consuming and undesirable for mass producing optical devices.

It would be desirable to provide improved methods for manufacturing stoichiometric lithium niobate and devices made from stoichiometric lithium niobate. In particular, it would be advantageous to provide methods that are simple and economical and that do not require extensive cleaning or polishing after adjustment of the stoichiometry of the elements. It would also be desirable to provide a method that is compatible with waveguide writing processes utilizing Ti thermal diffusion.

SUMMARY

The invention relates to methods of producing stoichiometric lithium niobate crystals and devices made from these crystals. The crystals are produced by adjusting the stoichiometry of a portion of a congruent niobate crystal substrate having a congruent composition until the portion of the substrate has a stoichiometric composition. As used herein, the terminology congruent composition refers to lithium niobate crystals having a composition that contains a lithium to niobium ratio of less than 1, and more specifically crystals that have a lithium to niobium ratio of 0.94. As used herein, the terminology "stoichiometric composition" refers to a lithium niobate substrate or portion thereof having a ratio of lithium to niobium that is approximately equal to 1, or in other words a 50/50 ratio of lithium to niobium.

One embodiment of the invention relates to a method of changing the stoichiometry of a lithium niobate substrate including mixing powders containing lithium and niobium and sintering the powders to provide a monolithic solid. In preferred embodiments, the composition of the sintered monolithic solid has a Li/Nb ratio greater than about 1, and more preferably the ratio of Li/Nb in the monolithic solid is greater than 1.5. The method further includes placing the monolithic solid proximate to the lithium niobate substrate and heating the monolithic solid and substrate to a temperature between 800° C. and 1200° C. for a period of time sufficient to change the stoichiometry in a portion of the substrate. Typically, the substrate and the monolithic substrate are separated by a distance of less than about 1 centimeter, preferably less than about 5 millimeters, and in highly preferred embodiments, the substrate and the monolith solid are separated by about 1 to 2 millimeters. Examples of powders that include lithium and niobium include, but are not limited to, lithium oxide, lithium carbonate, niobium oxide, niobium carbonate, lithium nitrate, lithium acetate, lithium chloride and mixtures thereof.

In certain embodiments of the invention, the powders are sintered at a temperature between 500° C. and 1200° C. for less than five hours. Preferably, the ratio of lithium to niobium in the solid is greater than the ratio of lithium to niobium in the substrate. In preferred embodiments, the ratio of lithium to niobium in the solid is greater than 1 and the ratio of lithium to niobium in the substrate is less than 1. Typically, the ratio of lithium to niobium in a lithium niobate crystal substrate having a congruent composition has a ratio of lithium to niobium of about 0.94. In certain embodiments, the substrate and the solid are heated to a temperature between 1000° C. and 1100° C. for less than about 30 hours, preferably less than about 25 hours and more preferably less than about 20 hours.

In certain embodiments of the invention, the substrate is a planar substrate, such as a wafer, and the stoichiometry of the substrate is changed in only a surface layer of the substrate. The surface layer of the substrate typically has a depth of less than about 200 microns. In some embodiments, the surface layer is less than about 100 microns, and in other embodiments the surface layer is less than 50 microns. In some embodiments of the invention, Ti is simultaneously diffused into the surface layer of the substrate while the substrate and the solid are being heated together.

Another embodiment of the invention relates to a method of producing a lithium niobate waveguide. This embodiment includes diffusing lithium from a monolithic solid containing lithium and niobate into a surface layer of a lithium niobate substrate having a ratio of lithium to niobium less than 1 and diffusing Ti into a surface layer of the lithium niobate substrate during the step of diffusing lithium into the surface layer of the substrate. Diffusion of lithium and titanium can be accomplished by heating the monolithic solid and the substrate to a temperature of between 1000° C. and 1200° C. The duration of the heating will depend on the actual temperature and the depth of diffusion desired. Preferably, the surface layer is less than about 200 microns, and after the step of diffusing lithium into the substrate, the substrate contains a ratio of lithium to niobium of 1 so that the surface layer has a stoichiometric composition.

The method of the present invention allows for the formation of lithium niobate substrates, having a Li/Nb ratio in surface layer of 1 and a Li/Nb ratio beneath the surface layer of less than 1. Such substrates can be used to manufacture optical devices including, but not limited to modulators and waveguides.

The present invention provides a relatively simple and inexpensive method of producing stoichiometric lithium niobate. By utilizing a monolithic solid to adjust the composition of a portion of a lithium niobate substrate, no additional cleaning or polishing is required to remove adhered powder particles to the surface of the substrate. In addition, the production method can be performed simultaneously with a Ti diffusion process for writing waveguides in lithium niobate substrates. Additional advantages of the invention will be set forth in the following detailed description. It is to be understood that both the foregoing general description and the following detailed description are exemplary and are intended to provide further explanation of the invention as claimed.

DETAILED DESCRIPTION

Figure 1:
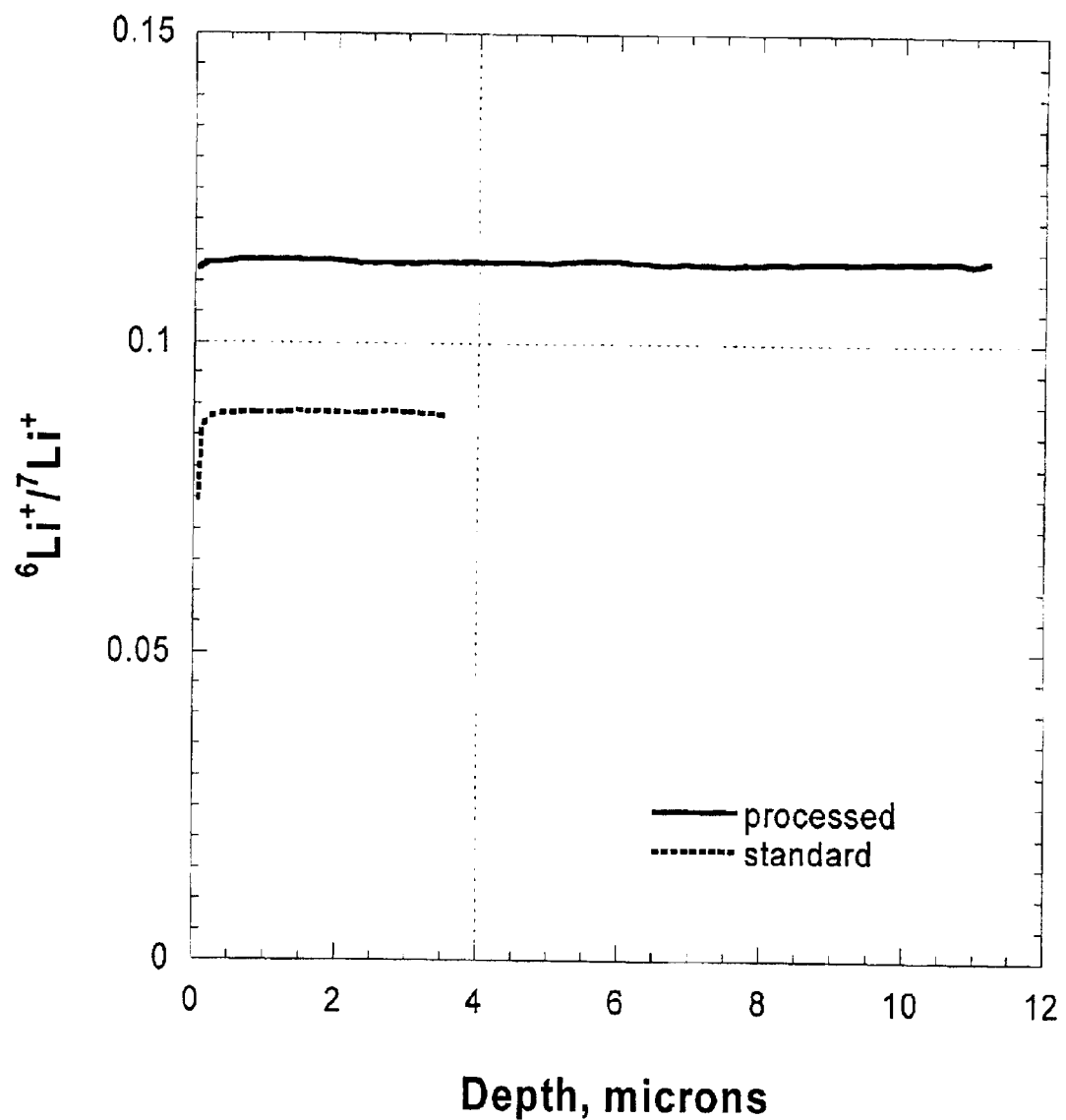
FIG. 1 is a graph showing the dynamic SIMS depth profile of lithium niobate wafers treated according to one embodiment of the invention and showing the variation of $^6Li^+/^7Li^+$.

The present invention is based on the need to provide a more economical process to produce crystals having stoichiometric compositions. In addition, there is a need to provide a method that is compatible with the Ti in-diffusion waveguide writing processes. It would be particularly desirable to provide a process that can be carried out simultaneously with the Ti waveguide writing process. The various embodiments of the present invention meet these needs.

Since waveguide fabrication processes involve writing or diffusing only in the uppermost 10 micron thickness of the lithium niobate wafer substrates, the stoichiometric composition is needed only in about a 15 to 30 microns surface layer of the wafer. The entire crystal substrate thus does not need to be of stoichiometric composition. The process of the present invention is compatible with the Ti waveguide writing process that forms waveguides via thermal diffusion. The Ti thermal diffusion is carried out at about 1050° C. in air or an excess oxygen atmosphere. According to certain embodiments of the present invention, the stoichiometry of a portion of lithium niobate substrates can be adjusted while simultaneously writing waveguides utilizing Ti diffusion.

The present invention utilizes a simple and economical process to generate the stoichiometric lithium niobate composition in a portion of the crystal substrate, preferably in a surface layer. In certain embodiments, lithium-containing powder and niobium-containing powder are mixed together and sintered into a monolithic solid mass at an appropriate temperature. For example, lithium carbonate and niobium oxide powders (or lithium oxide and niobium oxide powders) (99.99% purity) are mixed in appropriate proportions to obtain a lithium rich (i.e. greater than about 50:50 Li:Nb ratio) stoichiometry after sintering. The excess lithium-containing powders are then sintered at a low temperature, for example, between about 500° and 1200° C. to consolidate the powders and form a monolithic solid piece. A lithium niobate substrate such as a planar wafer of congruent composition, which typically has a ratio of lithium to niobium of about 0.94, is then placed in close proximity, preferably within less than about 1 centimeter, preferably less than about 5 millimeters and more preferably within 1–2 millimeters distance of the monolithic sintered solid piece with the surface intended for waveguide writing facing the monolith sintered solid piece. In preferred embodiments, the Li/Nb ratio in the monolithic solid is greater than one, and more preferably the ratio of Li/Nb in the monolithic solid is greater than 1.5. The lithium niobate substrate and the monolithic sintered solid samples are then heated to process temperatures of between about 800° and 1100° C. so that lithium ions diffuse takes place into the lithium niobate substrate. Factors such as the composition of the monolithic solid piece, the firing temperature, the length of time of the diffusion process, each contribute to the lithium concentration profile in the wafer. Therefore they are critical in the control of lithium in the surface portion of the substrate/wafer.

The invention is particularly useful for manufacturing a wide variety of elements comprising lithium niobate substrates. Such elements include, but are not limited to, electrooptic modulators, optical switches, high speed modulators, and waveguides. By providing a surface layer in the substrate having a stoichiometric composition, the operating characteristics of such devices are improved. In particular, the adjusted composition of the substrates having a stoichiometric composition possess higher electrooptic coefficients, higher non-linear characteristics, wider transparency range and higher resistance to optical damage.

Without intending to limit the invention in any manner, the present invention will be more fully described by the following examples.

EXAMPLE 1

Niobium oxide (65.95 wt. %) and lithium carbonate (34.05 wt. %) (Li/Nb ratio of 1.85) were mixed together thoroughly and sintered in a platinum crucible in air at 1050° C. for 2.5 hours. The lithium carbonate compound was enriched with $^6$Li isotope in order to facilitate composition analysis later on. The $^6$Li/$^7$Li isotope ratio in this compound was 0.93 as opposed to the natural abundance of 0.08. The sintered, monolithic sample was later used to treat LiNbO$_3$ congruent wafers. A commercial sample of a LiNbO$_3$ wafer 2 mm thick was prepared by thoroughly cleaning with distilled water followed by methanol, acetone and hydrogen peroxide soaks. The cleaned wafer was then placed on a Pt support. The sintered sample obtained earlier was placed under the wafer at a distance of about 2 mm. The assembly of the wafer and the sintered sample was heated in air to 1050° C. for 18 hours and then cooled to room temperature. The cooled wafer was analyzed for lithium to niobium ratio using secondary ion mass spectrometry (SIMS).

Two different SIMS methodologies were employed: dynamic SIMS (IMS 4F by Cameca, S.A.) and time-of-flight SIMS or ToF-SIMS (TRIFT II by Physical Electronics, Inc.). The former technique allows efficient sputtering of the surface region to depths of approximately 10 um, whereas the latter allows high-resolution depth profiling of a shallow region. In addition, the ToF-SIMS can be used to image the sample in cross-section to obtain chemical distribution maps. Using this methodology, deeper distributions can be obtained in short analysis times. In each experiment, an untreated crystal of congruent composition (Li/Nb=48/52) was always analyzed as a control.

Figure 2:
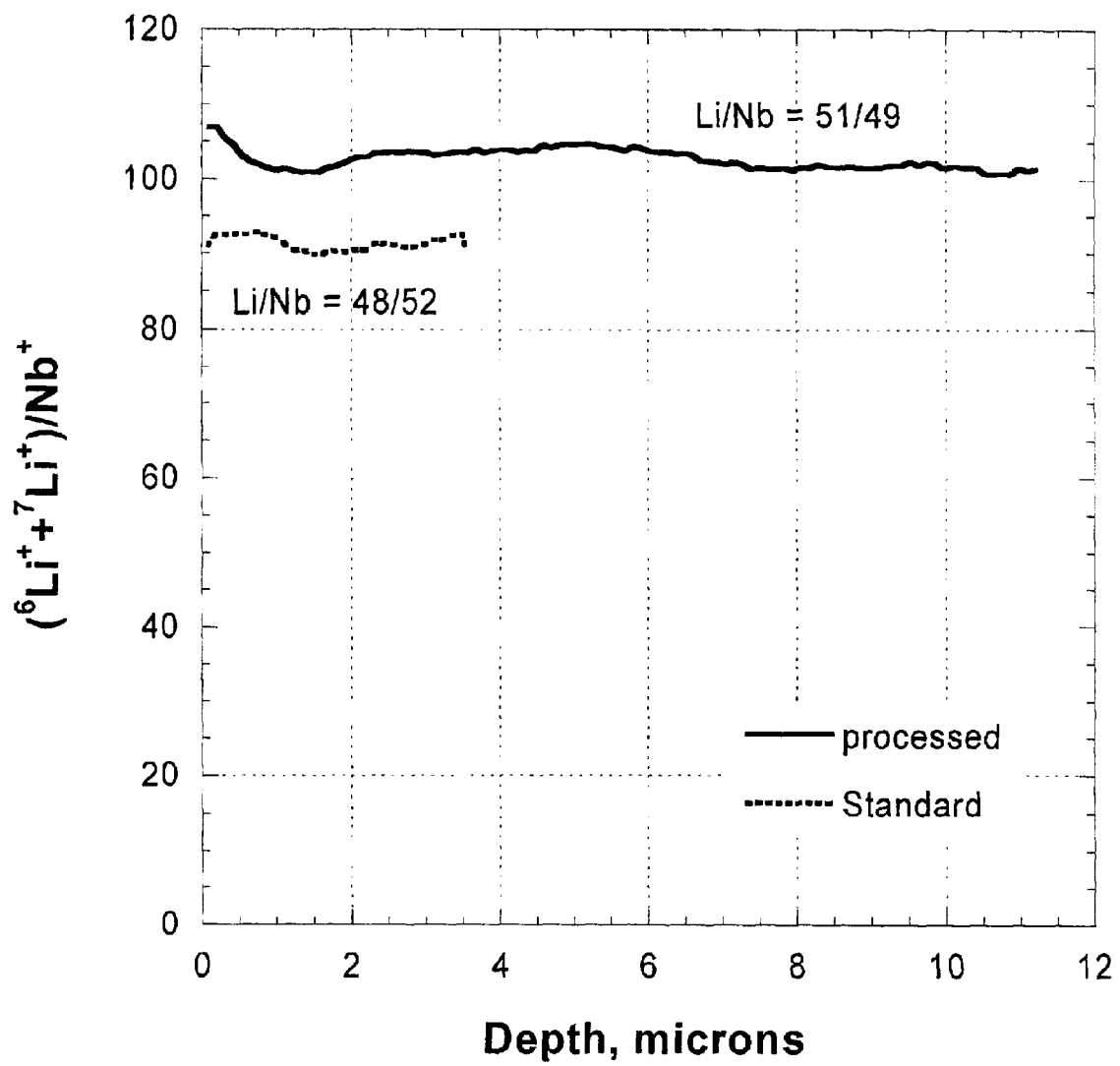
FIG. 2 is a graph showing the dynamic SIMS depth profile of lithium niobate wafers treated according to one embodiment of the invention and showing the variation of $Li^+/Nb^+$.
Figure 3:
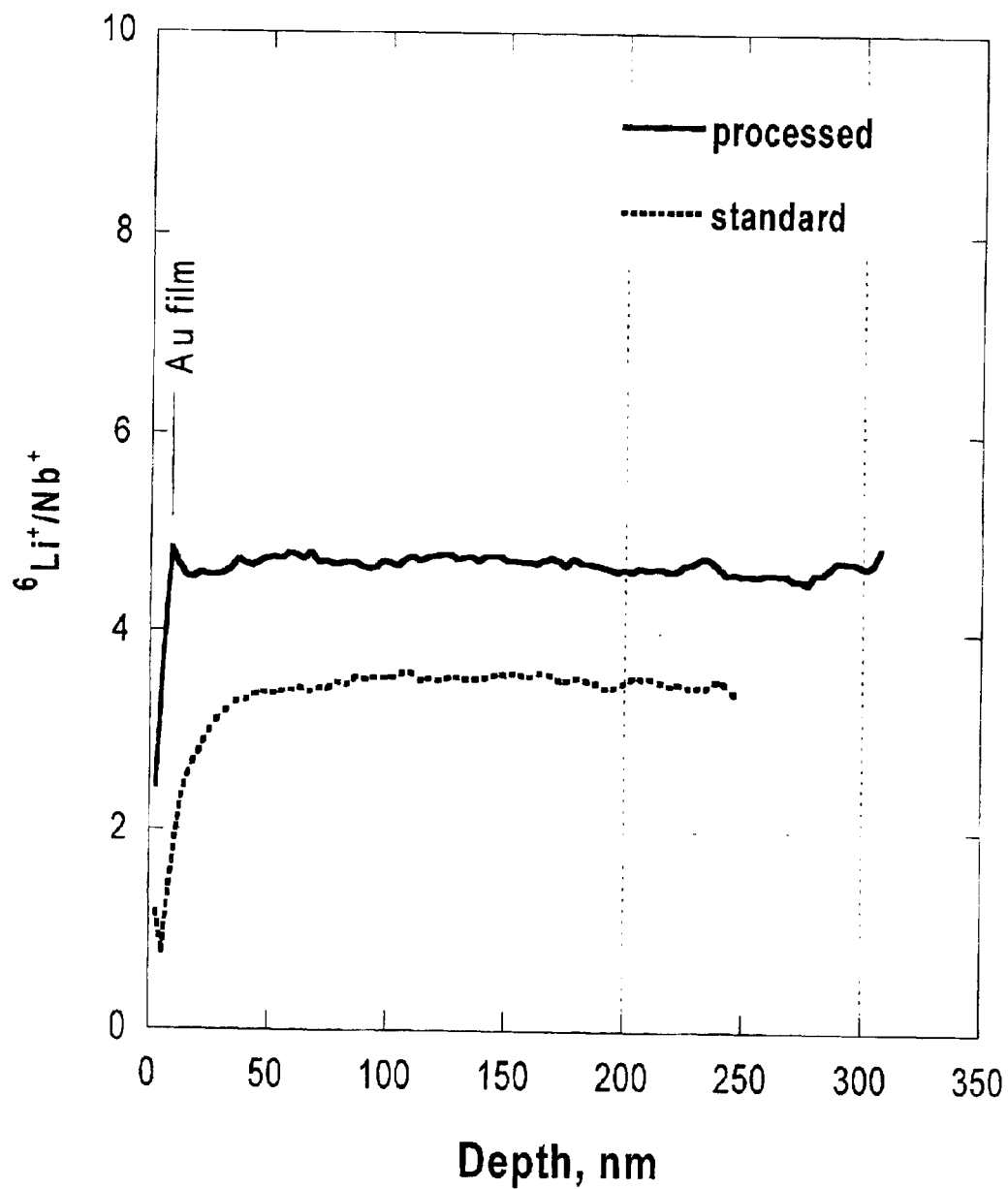
FIG. 3 is a graph showing the time of flight SIMS depth profile of lithium niobate wafers treated according to one embodiment of the invention and showing the variation of $^6Li^+/Nb^+$.

FIGS. 1 and 2 show dynamic SIMS depth profile of a crystal surface treated with a $^6$Li-enriched monolithic source. In FIG. 1, $^6$Li$^+$/$^7$Li$^+$ ratio is compared for the processed sample along with the untreated standard. The ratio is higher for the treated surface than that for the untreated control—direct evidence for Li diffusion into the crystal during this process. FIG. 2 shows that Li$^+$/Nb$^+$ ratio is also increased for the treated surface in comparison to the untreated control. The value of this signal ratio was converted to concentration ratio using the relative sensitivity factor method. This enriched Li/Nb concentration ratio occurs at least to the depth of 11 microns as measured in this analysis. The untreated congruent crystal had a nominal Li:Nb ratio of 48:52. The treated surface, however, shows that Li:Nb ratio is 51:49. This sample was also analyzed using ToF-SIMS depth profiling as shown in FIG. 3. Again, the $^6$Li$^+$/Nb$^+$ ratio is increased by the treatment suggesting that lithium enrichment occurs at the surface region. This example thus indicates that the process may be used to control the Li:Nb ratio.

Another very important observation from the data is that the ratio remains essentially constant to the analyzed depth of about 11 microns, the depth needed for waveguide writing. The process thus should be useful for fabricating wafers needed for waveguide fabrication with a controlled ratio of lithium and niobium.

EXAMPLE 2

Figure 4:
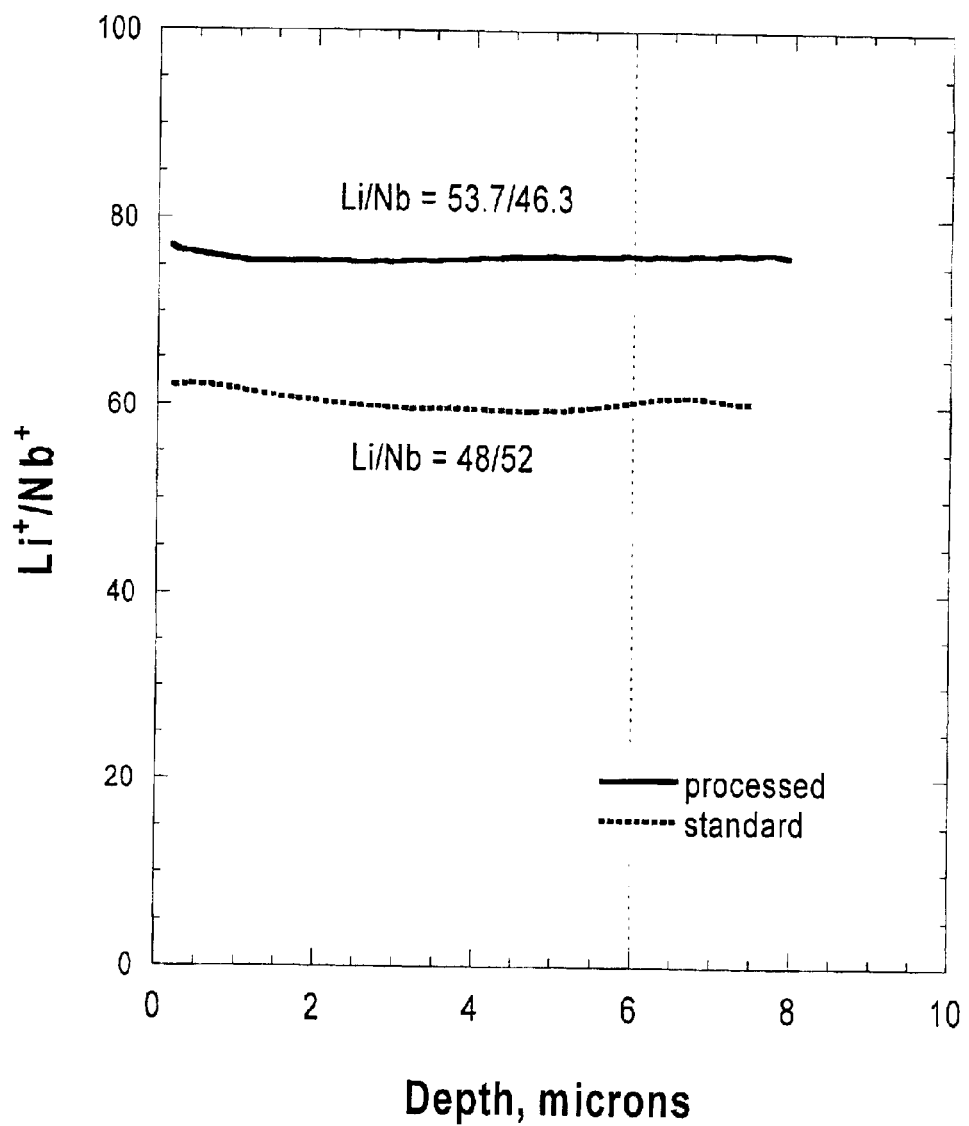
FIG. 4 is a graph showing the dynamic SIMS depth profile of lithium niobate wafers treated according to another embodiment of the invention and showing the variation of $Li^+/Nb^+$.

The above experiment was repeated but this time using natural lithium carbonate together with niobium oxide. The dynamic SIMS depth profile is shown in FIG. 4. The Li:Nb ratio is higher for the treated wafer (53.7:46.3) than that for the untreated control (48:52), representing a 22.8% increase. This increase in the Li:Nb ratio is observed up to the analyzed depth of about 8 microns.

The wafer after the treatments described in Examples 1 and 2 exhibited clean surfaces after treatment. This attribute is important because any significant distortion of the surface will have to be polished and removed making the process very expensive and time consuming. In addition, polishing will remove the depth of the layer having the adjusted Li/Nb ratio.

EXAMPLE 3

The experiment of Example 2 was repeated, except in this Example, the powders were not sintered into a monolithic sample as in the above Examples. The powder mixture was placed in a furnace in a crucible in close proximity to a commercial lithium niobate wafer and heated in the same manner as in the above Examples. The powder mixture sublimed and bonded strongly to the wafer surface. This necessitated a cleaning and polishing operation to remove the bonded material from the surface. Such a cleaning process resulted in distortion of the wafer surface and loss of expensive lithium niobate crystal. Of course, this results in additional cost of processing, which is very high since the surface has to be polished to optical requirements of typically less than 0.01 micron roughness. The problem of powder adhesion in this example would be significantly worse if the substrate was buried or in contact with the powder bed. Therefore, Examples 1 and 2, in which sintered monolithic samples were used to adjust the stoichiometry of the wafer is preferred over using powder mixtures to do so.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A method of changing the stoichiometry of a lithium niobate substrate comprising:
   mixing powders containing lithium and niobium;
   sintering the powders to provide a monolithic solid; and
   placing the monolithic solid proximate to the lithium niobate substrate and heating the monolithic solid and substrate to a temperature between 800° C. and 1200° C. for a period of time sufficient to change the stoichiometry in a portion of the substrate.

2. The method of claim 1, wherein the powders are selected from the group consisting of lithium oxide, lithium carbonate, niobium oxide, niobium carbonate, lithium nitrate and mixtures thereof.

3. The method of claim 2, wherein the powders are sintered at a temperature between 500° C. and 1200° C. for less than five hours.

4. The method of claim 1, wherein the ratio of lithium to niobium in the solid is greater than the ratio of lithium to niobium in the substrate.

5. The method of claim 4, wherein the ratio of lithium to niobium in the solid is greater than 1 and the ratio of lithium to niobium in the substrate is less than 1.

6. The method of claim 1, wherein the substrate and the solid are heated to a temperature between 1000° C. and 1100° C. for less than 25 hours.

7. The method of claim 1, wherein the distance between the substrate and the solid during the heating step is less than 1 centimeter.

8. The method of claim 1, wherein the substrate is a planar substrate, and the stoichiometry of the substrate is changed in only a surface layer of the substrate.

9. The method of claim 8, further comprising simultaneously diffusing Ti into the surface layer of the substrate.

10. The method of claim 8, wherein the depth of the surface layer is less than 200 microns.

11. The method of claim 1, wherein the ratio of lithium to niobium in the monolithic solid is greater than 1.

12. The method of claim 11, wherein the ratio of lithium to niobium in the monolithic solid is greater than 1.5.

13. A method of producing a lithium niobate waveguide comprising:
   diffusing lithium from a monolithic solid containing lithium and niobate into a surface layer of a lithium niobate substrate having a ratio of lithium to niobium less than 1; and
   diffusing Ti into a surface layer of the lithium niobate substrate during the step of diffusing lithium into the surface layer of the substrate.

14. The method of claim 13, further including the step of heating the monolithic solid and the substrate to a temperature of between 1000° C. and 1200° C.

15. The method of claim 14, wherein the depth of the surface layer is less than 200 microns.

16. The method of claim 15, wherein after diffusing lithium into the substrate, the surface layer of the substrate contains a ratio of lithium to niobium of 1.

17. The method of claim 13, wherein the ratio of lithium to niobium in the monolithic solid is greater than 1.

18. The method of claim 17, wherein the ratio of lithium to niobium in the monolithic solid is greater than 1.5.

* * * * *